(12) United States Patent
Hurwitz et al.

(10) Patent No.: US 8,884,607 B2
(45) Date of Patent: Nov. 11, 2014

(54) CURRENT MEASURING APPARATUS

(75) Inventors: Jonathan Ephraim David Hurwitz, Edingburgh (GB); Dale Stubbs, Edinburgh (GB)

(73) Assignee: Broadcom Corporation, Irvine, CA (US)

( * ) Notice: Subject to any disclaimer, the term of this patent is extended or adjusted under 35 U.S.C. 154(b) by 100 days.

(21) Appl. No.: 13/512,942

(22) PCT Filed: Dec. 1, 2010

(86) PCT No.: PCT/GB2010/052000
§ 371 (c)(1),
(2), (4) Date: May 31, 2012

(87) PCT Pub. No.: WO2011/067593
PCT Pub. Date: Jun. 9, 2011

(65) Prior Publication Data
US 2013/0127446 A1 May 23, 2013

(30) Foreign Application Priority Data
Dec. 2, 2009 (GB) .................................. 0921107.9

(51) Int. Cl.
*G01R 1/20* (2006.01)
*H02H 3/08* (2006.01)
*G01R 33/24* (2006.01)
*G01R 19/00* (2006.01)

(52) U.S. Cl.
CPC ............ *G01R 1/206* (2013.01); *G01R 19/0092* (2013.01); *H02H 3/08* (2013.01)
USPC .......................................... 324/126; 324/250

(58) Field of Classification Search
USPC ................ 324/126, 250, 601, 750.01; 361/42
See application file for complete search history.

(56) References Cited

U.S. PATENT DOCUMENTS

| | | | | |
|---|---|---|---|---|
| 4,829,218 A | * | 5/1989 | Bauer | 388/811 |
| 5,136,458 A | * | 8/1992 | Durivage, III | 361/93.2 |
| 5,418,677 A | | 5/1995 | Engel | |
| 5,644,510 A | * | 7/1997 | Weir | 702/132 |
| 5,898,557 A | * | 4/1999 | Baba et al. | 361/103 |
| 6,735,066 B2 | * | 5/2004 | Steffen | 361/119 |
| 2005/0212505 A1 | * | 9/2005 | Murray et al. | 324/126 |
| 2009/0237066 A1 | | 9/2009 | Gibellini | |
| 2012/0126839 A1 | * | 5/2012 | Schaefer et al. | 324/750.01 |

FOREIGN PATENT DOCUMENTS

| | | |
|---|---|---|
| DE | 10 2007 004387 A1 | 4/2008 |
| EP | 1 912 238 A1 | 4/2008 |
| WO | 2005050690 A1 | 6/2005 |

OTHER PUBLICATIONS

International Search Report, International Application No. PCT/GB2010/052000, Sep. 19, 2011, 4 pages.

* cited by examiner

*Primary Examiner* — Jermele M Hollington
*Assistant Examiner* — Raul Rios Russo
(74) *Attorney, Agent, or Firm* — Garlick & Markison; Randy W. Lacasse

(57) ABSTRACT

The present invention discloses a current measuring apparatus and associated networking apparatus, the current measuring apparatus comprising: a consumer unit comprising at least one interrupting device operative to interrupt a mains electricity supply when an excess current flows, such as a fuse box, a mains current circuit in the mains electricity supply path; and a measurement circuit that is operative to measure a voltage drop across the mains current circuit.

20 Claims, 2 Drawing Sheets

CURRENT MEASURING APPARATUS

FIELD OF THE INVENTION

The present invention relates to current measuring apparatus for measuring current drawn from a mains electricity supply.

BACKGROUND TO THE INVENTION

Increasing energy costs and an increase in environmental consciousness have given rise to an increase in interest in the monitoring of electricity consumption in the home and the workplace.

Mains current monitoring devices are known. For example, it is known to provide a resistive element in series with a mains connector of a consumer product to provide a measurement of mains current drawn by the consumer product. Such a resistive element is incorporated in the consumer product or forms part of an adapter that is plugged into a mains socket and to which the consumer product is connected.

It is an object for the present invention to provide an improved current measuring apparatus that is operative to measure current drawn from a mains electricity supply.

STATEMENT OF INVENTION

According to a first aspect of the present invention there is provided current measuring apparatus comprising:
a consumer unit comprising at least one interrupting device operative to interrupt a mains electricity supply when an excess current flows;
a mains current circuit in the mains electricity supply path; and
a measurement circuit that is operative to measure a voltage drop across the mains current circuit.

Consumer units are known. Such consumer units are operative to interrupt a mains electricity supply when an excess current flows. According to the present invention, a mains current circuit is provided in the mains electricity supply path and a measurement circuit is operative to measure the voltage drop across the mains current circuit. Measurement of the voltage drop enables the drawn current to be determined to thereby provide for current measurement. Measurement of current at the consumer unit confers advantages over measurement of current at individual consumer products, i.e. at distributed locations. More specifically, measurement of current at the consumer unit provides for measurement at a central location, which obviates the need to collate and aggregate measurements made at the distributed locations. The term consumer unit as used herein covers domestic consumer units and commercial electrical distribution boards.

Alternatively or in addition, the interrupting device may be one of a fuse and a circuit breaker. The consumer unit may comprise a plurality of interrupting devices, the consumer unit being configured such that each interrupting device is operative with a different mains circuit, e.g. first and second 15 Amp ring mains circuits, first and second 5 Amp lighting ring circuits and a 30 Amp circuit. The interrupting device may be contained within an enclosure. The consumer unit and the enclosure may be configured for repeated removal of the enclosure from and reattachment of the enclosure to the consumer unit, with the mains current circuit being contained within the enclosure. Thus, the current measuring apparatus may be readily installed in a consumer unit or replaced.

More specifically, the circuit breaker may be a Miniature Circuit Breaker (MCB). The MCB may be operable in dependence on mains current sensed by means of at least one of a thermal technique and a thermal-magnetic technique.

Alternatively or in addition, the mains current circuit may comprise a passive mains current circuit.

More specifically, the passive mains current circuit may comprise at least one of a resistor and a coil. The coil may be an inductor.

Alternatively or in addition, the coil may have an inductance of less than 100 mH. More specifically, the coil may have an inductance of less than 50 mH. Alternatively or in addition, the coil may have an inductance between substantially 100 mH and substantially 500 µH. Alternatively or in addition, the coil may have an inductance between substantially 50 mH and substantially 10 µH. For example, the coil may have an inductance of substantially 33 mH, substantially 150 µH or substantially 10 µH.

In a first form, the mains current circuit may be in series with the at least one interrupting device.

More specifically, the mains current circuit may be disposed on an output side of the interrupting device, i.e. on a same side as a mains circuit, such as a ring main, to which mains electricity is being supplied.

In a second form the mains current circuit may form part of the interrupting device. Thus, the present invention may make use of an existing component of the consumer unit.

More specifically, the mains current circuit may be a coil in the interrupting device, such as a coil of a solenoid when the interrupting device is an MCB.

Alternatively or in addition, the measurement circuit may comprise a passive measurement circuit. More specifically, the passive measurement circuit may comprise a measurement coil. Where the mains current circuit comprises a coil, the measurement coil may be disposed in relation to the coil such that current passing through the coil is inductively coupled to the measurement coil.

Alternatively or in addition, the measurement coil may have an inductance of less than 100 mH. More specifically, the measurement coil may have an inductance of less than 50 mH. Alternatively or in addition, the measurement coil may have an inductance between substantially 100 mH and substantially 500 µH. Alternatively or in addition, the measurement coil may have an inductance between substantially 50 mH and substantially 10 µH. For example, the measurement coil may have an inductance of substantially 33 mH, substantially 150 µH or substantially 10 µH.

Alternatively or in addition, the measurement circuit may comprise a current to voltage converter, such as a transimpedance amplifier, that is operative to receive current induced in the measurement coil and to convert the received current to a measured voltage, e.g. in the range zero to five volts, for subsequent processing.

Alternatively or in addition, the current measuring apparatus may further comprise a voltage processing circuit that is operative to sample a measured voltage. More specifically, the voltage processing circuit may comprise an analogue-to-digital circuit that is operative to convert a measured analogue voltage to a digital form.

Alternatively or in addition, the current measuring apparatus may further comprise a home networking node, which is operative to receive the measured voltage. In use, the home networking node may be used to store and convey the measured voltage or current to another location, such as another node within a home network for display to a user or for storage and subsequent read out to the user. Providing for such networked current measurement may make it more likely that a user of the current measuring apparatus utilises the current measurements compared with the known approach of making measurements and providing read out of current measurements at the consumer product. Alternatively or in addition, the home networking node may be used to store and convey the measured voltage or current to the supply side of the consumer unit, e.g. for conveyance to the electricity supply company for electricity consumption monitoring and charging purposes.

Alternatively or in addition, the current measuring apparatus may be configured to measure and store a series of discrete current measurements. The current measuring apparatus may be operative to output, e.g. to a user, a plot of measured current over time. More specifically, the current measuring apparatus may be configured to analyse the series of stored discrete current measurements. A deduction may be made in dependence upon the analysis. For example, the current measuring apparatus may be operative to determine at least one peak measured current and a time of said at least one peak. Such a deduction may be used to inform a user as to when peaks in power consumption occur. Alternatively, current measuring apparatus may be operative to detect a characteristic profile over time of a series of stored discrete current measurements. Such a characteristic profile may be indicative of removal of a mains current circuit (e.g. as part of the interrupting device) or other such circuit from the consumer unit and thereby provide an indication of tampering with the consumer unit.

Alternatively or in addition, the current measuring apparatus may be configured to receive a measurement of at least one of water consumption and gas consumption. More specifically, the current measuring apparatus may be configured to receive and store an electrical signal, e.g. a voltage level, corresponding to one of water and gas consumption.

Alternatively or in addition, a mains signal in the context of the present invention may be an AC voltage of 50 VRMS or greater according to standards defined by the International Electrotechnical Commission. Alternatively or in addition, a mains signal may have a frequency of less than 500 Hz, such as a frequency of substantially 60 Hz or substantially 50 Hz for domestic mains or a frequency of substantially 400 Hz for mains in ships.

According to a second aspect of the present invention, there is provided a networking apparatus comprising a current measuring apparatus according to the first aspect of the present invention and at least one networking node.

Embodiments of the second aspect of the present invention may comprise one or more features of the first aspect of the present invention.

BRIEF DESCRIPTION OF DRAWINGS

Further features and advantages of the present invention will become apparent from the following specific description, which is given by way of example only and with reference to the accompanying drawings, in which.

Figure 1:
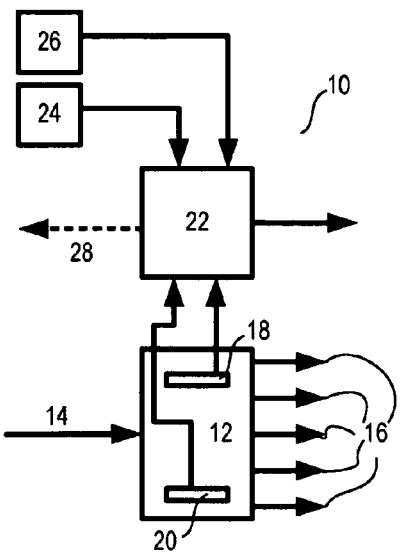
FIG. 1 is a block diagram of current measuring apparatus according to the present invention.

Current measuring apparatus 10 according to the present invention is shown in FIG. 1. The current measuring apparatus 10 comprises a consumer unit 12, which is installed in a residential or commercial building. The consumer unit 12 receives a mains input supply 14 and is configured to provide a plurality of mains output supplies 16, such as first and second 15 Amp ring mains circuits, first and second 5 Amp lighting ring circuits and a 30 Amp circuit. A Miniature Circuit Breaker (MCB) is in series with each of the mains output supplies 16 and, as is well known, is operative by means of a thermal technique or a thermal-magnetic technique to interrupt the mains supply when an excess current flows. As is described below in detail with reference to FIG. 2A and according to a first embodiment, the enclosure containing each MCB also contains a mains current circuit in series with the MCB. This form of enclosure (the first enclosure) is indicated in FIG. 1 by means of reference numeral 18. As is described below in detail with reference to FIG. 2B and according to a second embodiment, the enclosure containing each MCB also contains a mains current circuit in series with the MCB, and a measurement circuit. This form of enclosure (the second enclosure) is indicated in FIG. 1 by means of reference numeral 20. Each of the first enclosure 18 and the second enclosure 20 provides an output voltage corresponding to the voltage drop across the mains current circuit, which in turn corresponds to the drawn current. Each output voltage is received in a network node 22, which forms part of a network as described below with reference to FIG. 3. As is described below in detail with reference to FIG. 2C and according to a third embodiment, at least one of the enclosures other than the first and second enclosures contains the MCB and a measurement circuit, with a coil of the MCB constituting the mains current circuit. The network node 22 also receives an analogue output voltage or a digital signal from a first sensor 24, which is operative to measure the gas consumed in the building, and from a second sensor 26, which is operative to measure water consumed in the building. The first and second sensors are flow sensors that are designed and operative in accordance with well known design principles and practice. The analogue output voltages or digital signals from the first and second sensors 24, 26 are stored in the network node and thereafter transmitted over the network with the measured current values. Alternatively, stored measured data is transmitted from the building over a communications link 28 to an external recipient, such as a utility company, for consumption monitoring and charging purposes.

Figure 2A:
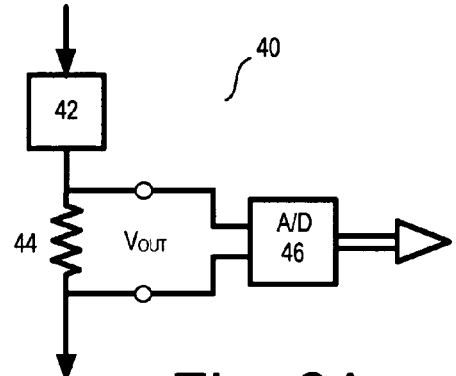
FIG. 2A shows part of a first embodiment of current measuring apparatus.

A first embodiment of current measuring apparatus is shown in part in FIG. 2A. More specifically, FIG. 2A shows the first enclosure 40. As described above, the first enclosure comprises a Miniature Circuit Breaker (MCB) 42 in series with a resistor 44 of 1 Ohm (which constitutes a mains current circuit), with the resistor being located on the output side of the MCB. The voltage across the resistor 44 is measured by an analogue-to-digital converter 46 (which constitutes a measurement circuit), which is contained within the first enclosure. Alternatively, the analogue-to-digital converter 46 may form part of the network node 22; in this form a buffer (not shown) is contained in the first enclosure, with the buffer being in series between the resistor 44 and the analogue-to-digital converter 46.

Figure 2B:
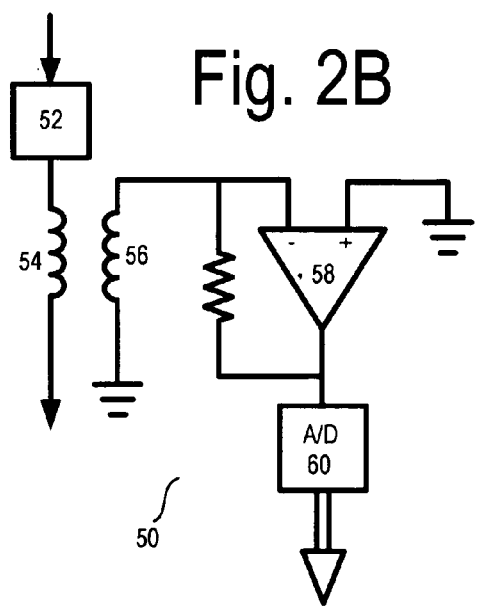
FIG. 2B shows part of a second embodiment of current measuring apparatus.

A second embodiment of current measuring apparatus is shown in part in FIG. 2B. More specifically, FIG. 2B shows the second enclosure 50. As described above, the second enclosure comprises a Miniature Circuit Breaker (MCB) 52 in series with a coil 54 of 33 mH (which constitutes a mains current circuit), with the coil being located on the output side of the MCB. The second enclosure also contains a measurement coil of 33 mH 56 (which constitutes a measurement circuit), with the measurement coil being disposed in relation to the coil 54 such that current passing through the coil is coupled inductively to the measurement coil. Current passing through the measurement coil 56 is converted to a voltage by means of a transimpedance amplifier 58 for conversion to a digital signal by means of an analogue-to-digital converter 60. The transimpedance amplifier 58 is contained in the second enclosure. The analogue-to-digital converter 60 is also contained within the second enclosure. Alternatively, the analogue-to-digital converter 60 may form part of the network node 22.

Figure 2C:
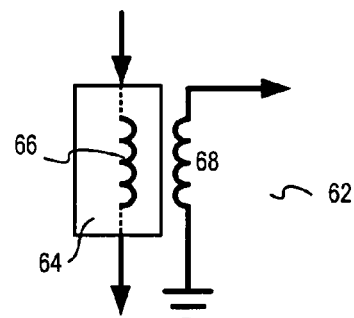
FIG. 2C shows part of a third embodiment of current measuring apparatus.

A third embodiment of current measuring apparatus is shown in part in FIG. 2C. More specifically, FIG. 2C shows an enclosure 64, which contains an MCB having a solenoid that is operative to interrupt the mains electricity supply when an excess current flows. The solenoid comprises a coil 66 (which constitutes a mains current circuit). The enclosure 64 also contains a measurement coil 68 of 33 mH (which constitutes a measurement circuit), with the measurement coil being disposed in relation to the coil 66 such that current passing through the coil is coupled inductively to the measurement coil 68. Current passing through the measurement coil 68 is converted to a voltage by means of a transimpedance amplifier (not shown in FIG. 2C) for conversion to a digital signal by means of an analogue-to-digital converter (also not shown in FIG. 2C) in the same manner as for the second embodiment. The transimpedance amplifier is contained in the enclosure. The analogue-to-digital converter is also contained within the enclosure. Alternatively, the analogue-to-digital converter may form part of the network node 22.

Figure 3:
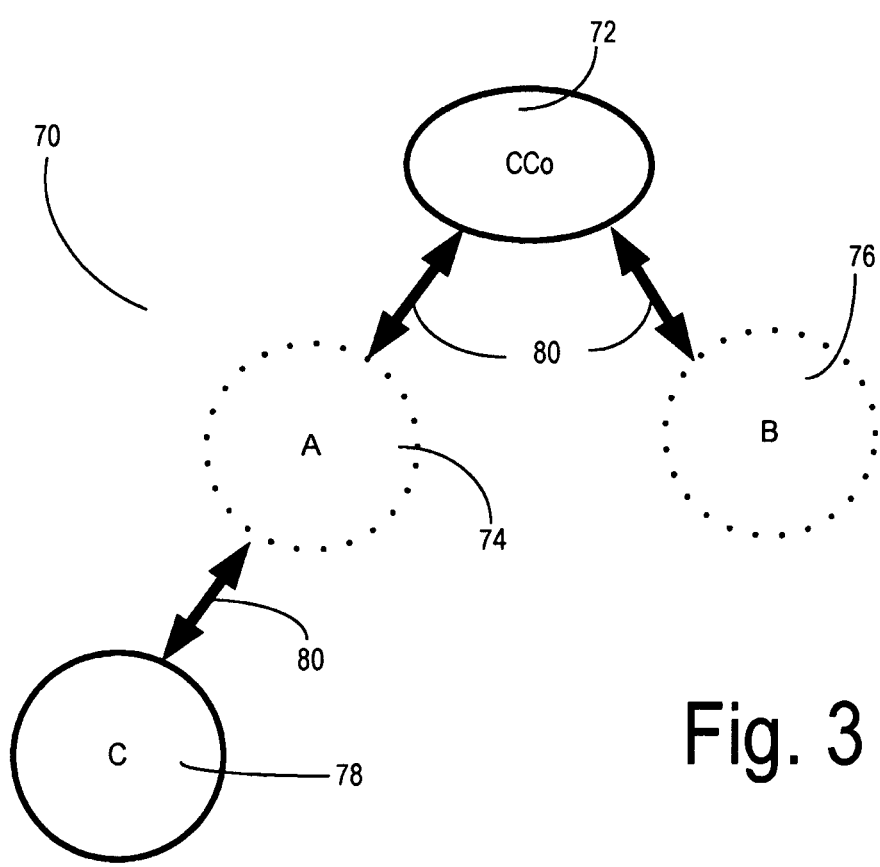
FIG. 3 is a representation of a network of consumer products in a building.

FIG. 3 shows a network 70 of consumer products in a building. The network comprises first 72, second 74, third 76 and fourth 78 nodes. Adjacent pairs of nodes are connected to each other by an already installed communications medium 80, such as mains power wiring, which provides for communication between and amongst a plurality of rooms in the residential building. Thus, for example, each of the first to fourth nodes may be located in a different room of the residential building. Each of the first to third nodes comprises a different multi-media device (which constitutes a consumer product). Thus, for example, the first node 72 comprises a Home Gateway (HGW), the second node 74 comprises Personal Computer (PC) and the third node 76 comprises audio-visual entertainment apparatus. The fourth node 78 is the network node 22 at the consumer unit as shown in FIG. 1. In the network 70 of FIG. 3 the first node 72 is configured to operate as a communications controller, the second 74 and third 76 nodes are configured to operate as repeater nodes and the fourth node 78 is configured to operate as a standard network node. A communications controller controls the function of the network to which it belongs. Normally there is only one communications controller in a network. A standard node provides for communication of data from the branch of the communications medium leading to the node to the branch of communications medium leading from the node and for communication with the multi-media device connected to the node. A repeater node provides for communication of data from the branch of the communications medium leading to the node to the branch of communications medium leading from the node but provides for no communication with the multi-media device connected to the node, e.g. where the multi-media device is not being used. Referring to FIG. 3, the configuration of the nodes might be such that the HGW connected to the first node is streaming a film from an external source to the network and the NAS connected to the fourth node 78 might be saving the film. Network node apparatus is present at each of the first to third nodes 72, 74, 76, of FIG. 3; as mentioned above the fourth node 22, 78 is adjacent the consumer unit of FIG. 1.

The network node apparatus of FIG. 3 comprises a home networking integrated circuit (a GGL541 from Gigle Semiconductors Ltd of Capital House, 2 Festival Square, Edinburgh, EH3 9SU, UK) provided within an appropriate enclosure. Network node apparatus is operative to provide for communication with a consumer product by way of an Ethernet communications controller and with the other nodes in the network over at least one of mains power wiring, co-axial cable and phone line. Reference should be made to publicly available product data from the vendor of the GGL541; such product data provides sufficient information for the skilled person to implement the network shown in FIG. 3 without resorting to any more than ordinary design skill.

As described above, current, gas and water measurements are stored in the fourth network node 22, 78. The stored measurements are then transmitted to the communications controller 72 for storage there and subsequent read out to the user. Thus measurements are made at the fourth network node 22, 78 and conveyed to a central location for ease of reference by the user. Alternatively, the measurements are read out to the user at the fourth network node 22, 78. In addition, the communications controller 72 is operative to analyse a series of stored discrete measurements, such as current measurements. The communications controller 72 is operative to determine at least one peak measured current and a time of said at least one peak, with the deduction being used to inform a user as to when peaks in power consumption occur. Also, the communications controller 72 is operative to detect a characteristic profile over time of a series of stored discrete current measurements. Such a characteristic profile is indicative of removal of an enclosure, such as the first or second enclosure from the consumer unit, to thereby provide an indication of tampering with the consumer unit. The communications controller 72 is operative to perform the above described analyses and deductions by means of firmware resident in and operative on a microcontroller of the communications controller 72. The design of such firmware is within the scope of the ordinary design skills of the skilled person.

The invention claimed is:
1. An apparatus comprising:
a plurality of interrupting devices, each having a mains electricity input and a mains electricity output and operable to disconnect the mains electricity input from the mains electricity output upon receipt of an overcurrent control signal;
a plurality of current detectors corresponding to the plurality of interrupting devices, each comprising:
a mains current circuit disposed in a corresponding mains electricity supply path;
and
a measurement circuit operable to measure a voltage drop across the mains current circuit; and
a control circuit coupled to the plurality of interrupting devices and the plurality of current detectors, the control circuit operable to:
receive voltage drop inputs from the plurality of current detectors;
produce the overcurrent control signals upon detection of respective overcurrent conditions based upon respective voltage drop inputs; and
determine and store a series of discrete current measurements of at least one of the plurality of current detectors; and communicate one or more of voltage, overcurrent or current data to at least one remote device via a network interface.

2. The apparatus of claim 1, wherein the plurality of interrupting devices comprises one of fuses or circuit breakers.

3. The apparatus of claim 2, wherein circuit breakers comprise Miniature Circuit Breakers (MCBs).

4. The apparatus of claim 3, wherein at least one MCB is further operable to disconnect the mains electricity input from the mains electricity output based upon current sensing of at least one of a thermal technique and a thermal-magnetic technique.

5. The apparatus of claim 1, wherein at least one mains current circuit comprises a passive mains current circuit.

6. The apparatus of claim 5, wherein the passive mains current circuit comprises at least one of a resistor or a coil.

7. The apparatus of claim 6, wherein the coil is an inductor.

8. The apparatus of claim 1, wherein at least one mains current circuit is in series with a corresponding interrupting device.

9. The apparatus of claim 8, wherein the at least one mains current circuit is coupled to a mains electricity output of a corresponding interrupting device.

10. The apparatus of claim 9, wherein the mains current circuit forms part of the corresponding interrupting device.

11. The apparatus of claim 10, wherein the mains current circuit comprises a coil in the corresponding interrupting device operable to cause a mains electricity supply interrupt.

12. The apparatus of claim 1, wherein at least one mains current circuit is a coil of a solenoid of a Miniature Circuit Breakers (MCB) that serves as a corresponding interrupting device.

13. The apparatus of claim 1, wherein:
at least one mains current circuit comprises a coil; and
at least one measurement circuit comprises a measurement coil that is disposed in relation to the coil such that current passing through the coil is inductively coupled to the measurement coil.

14. The apparatus of claim 13, wherein the measurement circuit comprises a current to voltage converter operable to receive current induced in the measurement coil and to convert the received current to a measured voltage for subsequent processing.

15. The apparatus of claim 1, wherein the network interface supports powerline communications.

16. An apparatus comprising:
a plurality of interrupting devices, each having a mains electricity input and a mains electricity output and operable to disconnect the mains electricity input from the mains electricity output upon receipt of an overcurrent control signal;
a plurality of current detectors corresponding to the plurality of interrupting devices, each comprising:
a mains current coil disposed in a corresponding mains electricity supply path;
a measurement coil coupled to the mains current coil and operable to measure a voltage drop across the mains current circuit;
a conversion circuit operable to convert the voltage drop to a current measurement; and
a control circuit coupled to the plurality of interrupting devices and to the plurality of current detectors, the control circuit operable to:
receive current measurements from the plurality of current detectors; and
produce the overcurrent control signals upon detection of respective overcurrent conditions based upon the current measurements; and
a powerline communication network interface coupled to the control interface and operable to communicate data regarding the respective current measurements and data regarding the respective overcurrent control signals to at least one remote device.

17. The apparatus of claim 16, wherein at least one interrupting device is further operable to disconnect a mains electricity input from a mains electricity output based upon current sensing of at least one of a thermal technique and a thermal-magnetic technique.

18. A method comprising:
receiving mains electricity input at a plurality of interrupting devices;
for each interrupting device, selectively producing the mains electricity at a plurality of mains electricity outputs based upon a respective overcurrent control signals;
detecting mains current in each of a plurality of mains current coils disposed in corresponding mains electricity supply paths;
measuring voltage drop across the plurality of coil by a plurality of measurement coils coupled to the plurality of mains current coils;
converting the voltage drops to a-current measurements;
producing the overcurrent control signals upon detection of respective overcurrent conditions based upon respective current measurements;
collecting and storing in memory data including one or more of: current measurements or overcurrent conditions; and
communicating the stored data regarding the respective current measurements and data regarding the respective overcurrent control signals to at least one remote device via a communications network interface.

19. The method of claim 18, further comprising disconnecting a mains electricity input from a mains electricity output based upon current sensing of at least one of a thermal technique or a thermal-magnetic technique.

20. The method of claim 18, further comprising detecting, measuring, storing in the memory and communicating the stored data of at least one of: water consumption or gas consumption.

* * * * *